United States Patent [19]
Sugiyama et al.

[11] Patent Number: 6,052,282
[45] Date of Patent: Apr. 18, 2000

[54] ELECTRONIC EQUIPMENT

[75] Inventors: Akira Sugiyama, Mitaka; Tsutomu Hoshino, Otsuki; Shinichi Yoshida, Hino; Tan Tjang Joeng, Asaka, all of Japan

[73] Assignee: Kabushiki Kaisha Toshiba, Kawasaki, Japan

[21] Appl. No.: 09/345,444

[22] Filed: Jul. 1, 1999

[30] Foreign Application Priority Data

Jul. 3, 1998 [JP] Japan .................................. 10-189121

[51] Int. Cl.[7] ...................................................... H05K 7/20
[52] U.S. Cl. .......................... 361/690; 361/704; 361/707; 361/715; 361/716; 361/720; 361/721; 174/16.1; 165/80.3; 165/104.33; 454/184
[58] Field of Search ..................................... 361/678, 679, 361/688–690, 692–695, 704, 716, 715, 720, 721; 174/15.1, 16.1, 16.2; 165/80.3, 104.33, 104.34; 454/184

[56] References Cited

U.S. PATENT DOCUMENTS

| | | | |
|---|---|---|---|
| 4,158,875 | 6/1979 | Tajima et al. ............................ | 361/678 |
| 4,293,891 | 10/1981 | Matsui et al. ............................ | 361/692 |
| 4,612,979 | 9/1986 | Heitzig .................................... | 165/129 |
| 5,105,336 | 4/1992 | Jacoby et al. ........................... | 361/690 |

*Primary Examiner*—Leo P. Picard
*Assistant Examiner*—Boris L. Chervinsky
*Attorney, Agent, or Firm*—Finnegan, Henderson, Farabow, Garrett & Dunner, L.L.P.

[57] ABSTRACT

The present invention aims to radiate heat efficiently from the inside of an equipment housing, with a simple structure. First and second through air passageways are formed at the sides of first to third equipment housings and the second through air passageway communicates with a recess air passageway to supply air from the first through air passageway into the first to third equipment housings, discharge the exhaust from the first equipment housing directly out of the equipment through a second window portion, and lead the exhaust from the second and third equipment housings into the second through air passageway through the second window portion and the recess air passageway and discharge it out of the equipment.

18 Claims, 12 Drawing Sheets

PRIOR ART

FIG. 4

PRIOR ART

ELECTRONIC EQUIPMENT

BACKGROUND OF THE INVENTION

The present invention relates to electronic equipment containing electronic circuit units including power supply units, such as telephone exchanges and the like.

Figure 1:
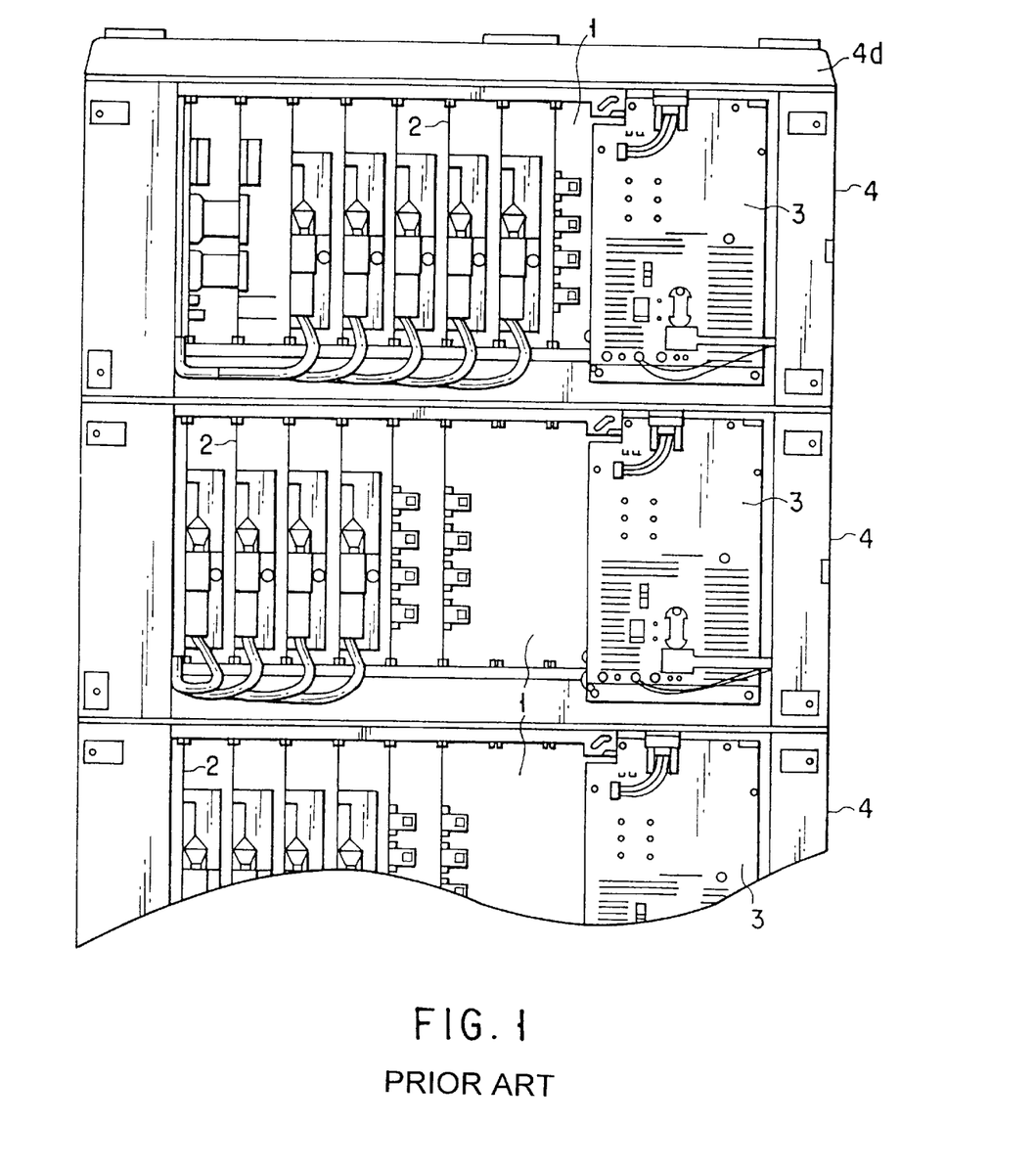
FIG. 1 is a block diagram showing a schematic structure of an equipment housing in a building block type.

In general, in telephone exchanges, as shown in FIG. 1, a housing construction called a building block type where a plurality of equipment housings 4 each containing a system circuit board 1, a plurality of electronic circuit units 2 and a power supply unit 3 are tiered, is employed. In addition, in such a telephone exchange, a heat radiation construction is employed since heat is generated from the system circuit board 1, the electronic circuit units 2 and the power supply unit 3 contained in the equipment housing 4. As for the heat radiation construction, for example, a method of taking in air through a ventilation hole 4g of a front cover 4f shown in FIG. 2, and exhausting air by providing air passageways 4a between the equipment housings 4 and making the air passageways 4a communicate with through air passageways 4b and 4c that are provided to pass through the equipment housings 4 as shown in FIG. 3, to radiate heat in the equipment housings 4 outside the housings through window portions 4h and 4i of the through air passageways 4b and 4c and through ventilation holes 4e of a top cover 4d, is known.

In the telephone exchange, however, heat is hardly radiated outside the equipment housings 4 at high efficiency, and the temperature in the equipment housings 4 rises because of influence of air flow or the like. For this reason, the system circuit boards 1, the electronic circuit units 2 and the power supply units 3 may be broken.

Figure 4:
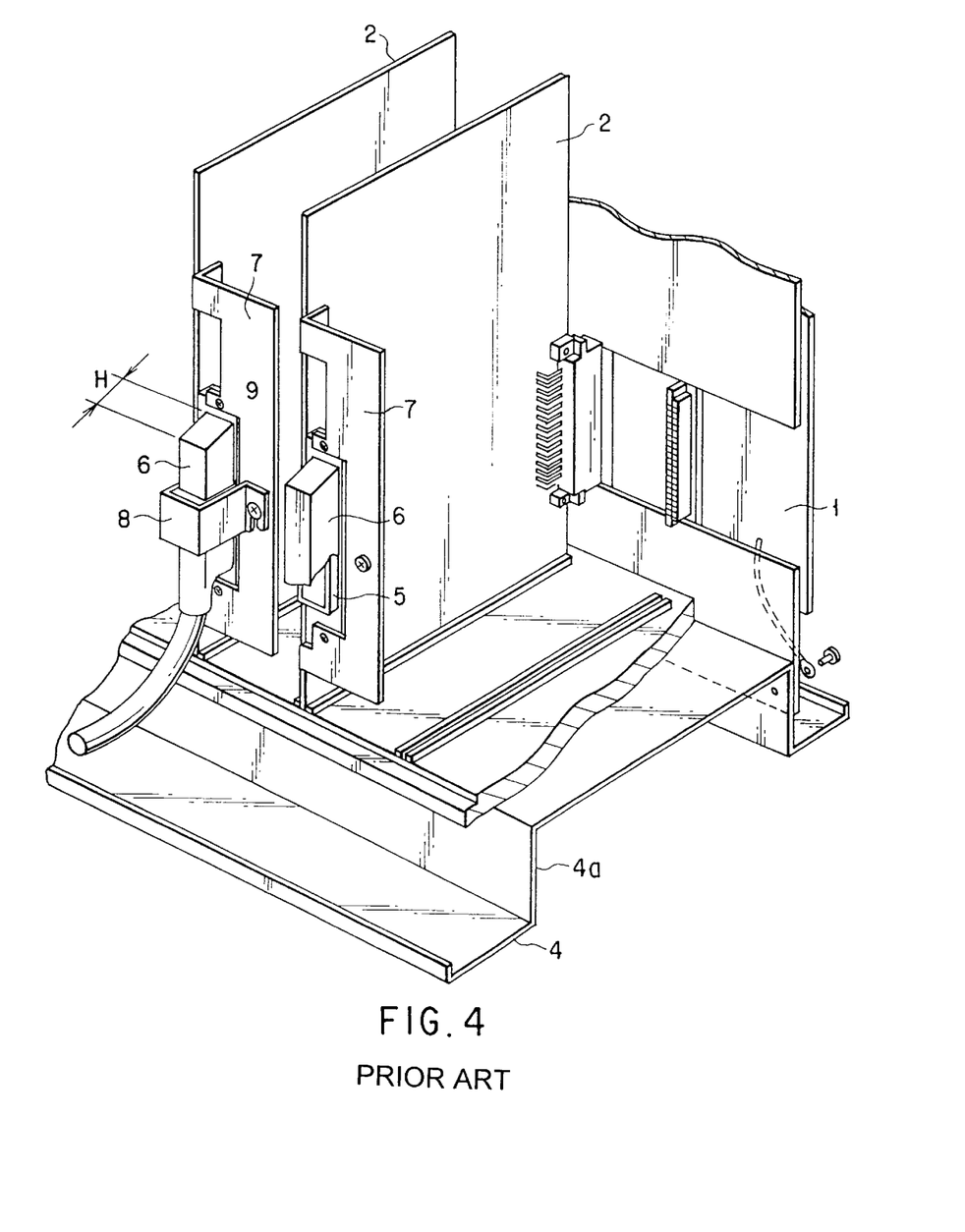
FIG. 4 is a sectional view to explain a problem of a conventional equipment housing.

Further, as shown in FIG. 4, the electronic circuit units 2 of the equipment housing 4 are mounted on the system circuit board 1 contained in the equipment housing 4, and connectors 5 for external connection thereof are selectively fitted to, for example, connectors 6 to be connected to telephone terminals. The connectors 5 are fixed to the electronic circuit units 2 via support members 7, and are arranged to have a desired rigidity.

Incidentally, fixing elements 8 are provided as means for preventing the connectors 6 from detaching from the connectors 5, in a state where the connectors 6 are fitted to the connectors 5, and the connectors 6 are positioned at fitting locations by fixing the fixing elements 8 by means of screw members 9.

According to the fixing means, however, since an attachment height H of the connectors 6 is varied in accordance with the kind of the telephone terminals, various kinds of fixing elements 8 corresponding to the variation of the height H need to be prepared. For this reason, the inventory control becomes very complicated and assembly operations become very troublesome.

Such circumstances are the same in various kinds of electronic equipment where electronic circuit units such as host computers and the like are contained in an equipment housing.

As stated above, the conventional electronic equipment has the problem that radiation at high efficiency is difficult or the assembly and management is very troublesome.

BRIEF SUMMARY OF THE INVENTION

The present invention has been accomplished to solve above problem and its object is to provide electronic equipment which can realize highly efficient radiation in a simple structure.

Another object of the present invention is to provide electronic equipment which can realize simple and easy assembly and management.

The present invention provides electronic equipment comprising: a plurality of equipment housings containing electronic circuit units and being tiered; first and second housing through air passageways provided respectively at both sides sandwiching the electronic circuit units of the plural equipment housings, the first housing through air passageways communicating with each other and the second housing through air passageways communicating with each other; first air passageways provided respectively at lower parts of the plural equipment housings to supply air of the first housing through air passageway into the insides of the plural equipment housings; ventilation windows provided respectively at upper parts of the plural equipment housings; and second air passageways provided respectively at bottom portions of the plural equipment housings to transmit heat from the ventilation windows of the equipment housings at lower stages into the second housing through air passageway.

According to the above structure, air is supplied from the first air passageways into the insides of the equipment housing, the air including the heat which is generated by the electronic circuit units contained in the equipment housings is discharged through the ventilation windows or the second air passageways, and thereby the heat in the housings is controlled. As a result, heat can be radiated from the insides of a plurality of tiered equipment housings at high efficiency.

It is preferable that the first air passageways and the ventilation windows are provided in the vicinity of the electronic circuit units generating a large amount of heat. If an air suction mechanism and a discharge mechanism are provided in the vicinity of a heat source in this manner, radiation can be carried out at higher efficiency.

It is also preferable that ventilation holes are provided respectively on front surfaces of the plural equipment housings. In this structure, the air is suctioned from the ventilation holes on the front surfaces of the equipment housings and thereby the radiation efficiency is further improved.

In addition, the present invention provides an equipment housing containing electronic circuit units, comprising: first and second air passageways provided at both sides sandwiching the electronic circuit units; a third air passageway provided at a lower part of the equipment housing to supply air in the first air passageway into the insides of the equipment housing; a ventilation window provided at an upper part of the equipment housing; and a fourth air passageway provided at a bottom part of the equipment housing to supply air into the second air passageway.

In the above structure, the air is supplied from the first air passageway into the inside of the equipment housing, the air including the heat which is generated by the electronic circuit units contained in the equipment housing is discharged through the ventilation windows, and thereby the heat in the housing is controlled. As a result, heat can be radiated from the inside of the equipment housing at high efficiency.

In addition, the present invention provides electronic equipment comprising a plurality of equipment housings containing electronic circuit units and being tiered, and each of the equipment housings comprises: first and second air passageways provided at both sides sandwiching the electronic circuit units; a third air passageway provided at a lower part of the equipment housing to supply air in the first air passageway into the inside of the equipment housing; a ventilation window provided at an upper part of the equipment housing; and a fourth air passageway provided at a bottom part of the equipment housing to supply air into the second air passageway, wherein the first air passageways of the plural equipment housings communicate with each other, the second air passageways of the plural equipment housings communicate with each other and air is supplied to the fourth air passageway located at a higher equipment housing through the ventilation window located at a lower equipment housing.

In the above structure, the air is supplied from the first air passageways into the insides of the equipment housing, the air including the heat which is generated by the electronic circuit units contained in the equipment housing is discharged through the ventilation windows or the second air passageway, and thereby the heat in the housing is controlled. As a result, heat can be radiated from the insides of a plurality of the tiered equipment housings at high efficiency.

Further, the present invention provides electronic equipment comprising: electronic circuit units contained in equipment housings; a first connector to be connected to a second connector, provided on each of the electronic circuit units by means of a support member; at least a pair of attachment holes provided on the support member to sandwich the first connector, the attachment being formed from an elongated hole and a through hole located at an end of the elongated hole;

a first band detachably inserted into one of the pair of attachment holes, comprising at one end an attachment portion where a first engagement portion that passes through the elongated hole and has a sectional length larger than a diameter of the through hole, a through portion which passes through the through-hole, and a second engagement portion that does not pass through the elongated hole and the through hole are formed in order, and comprising at the other end engaging means; and a second band detachably inserted into the other of the pair of attachment holes, comprising at one end an attachment portion where a first engagement portion that passes through the elongated hole and has a sectional length larger than a diameter of the through hole, a through portion which passes through the through-hole, and a second engagement portion that does not pass through the elongated hole and the through hole are formed in order, and comprising at the other end engaging means for adjustably engaging with the engaging means of the first band, wherein the first and second bands incorporate with one another to restrict a position of the second connector fitted with the first connector, on the support member.

In the above structure, the attachment portions of the first and second bands are inserted into the attachment hole of the support member, the engaging means of the first band is engaged with that of the second band that is to be adjustably engaged with the engaging means of the first band, and the second connector fitted on the first connector of the electronic circuit unit is positioned and fixed on the support member. As a result, the connectors having different shapes and dimensions can be positioned and fixed at the support member by using the fist and second bands, management of parts can be simplified and the workability of the assembly operations can be improved.

It is also preferable that the engaging means of the first band are a plurality of engagement claws provided with a predetermined distance disposed therebetween, and that the engaging means of the second band is a latch for selectively engaging with any one of the plurality of engagement claws and for cooperating with the first band to restrict on the support member the position of the second connector fitted on the first connector.

In the above structure, the attachment portions of the first and second bands are inserted into the attachment hole of the support member, any one of plural engagement claws of the first band is latched by the latch portion of the second band, and the second connector fitted on the first connector of the electronic circuit unit is positioned and fixed on the support member. As a result, the connectors having different shapes and dimensions can be positioned and fixed at the support member by using the fist and second bands, management of parts can be simplified and the workability of the assembly operations can be improved.

It is also preferable that the attachment hole includes a circular through hole formed at one end portion of the elongated hole to have a diameter larger than a width of the elongated hole, and that the through portion is formed to have a sectional length smaller than the diameter of the through hole and larger than the width of the elongated hole.

In the above structure, when the first engagement portion of the band is inserted into the elongated hole of the attachment hole and then the through portion is moved in the through hole of the attachment hole to rotate the band at approximately 90 degrees, the through portion can be prevented from vertically moving in the attachment hole.

In is also preferable that the attachment hole includes a circular through hole formed at one end portion of the elongated hole to have a diameter smaller than the length of the elongated hole.

If the attachment hole thus formed is used, when the first engagement portion of the band is inserted into the elongated hole of the attachment hole and then the through portion is moved in the through hole of the attachment hole to rotate the band at approximately 90 degrees, the first engagement portion can be prevented from passing through the through hole and coming out therefrom.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

An embodiment of the present invention will be explained below in detail with reference to the drawings.

Figure 5:
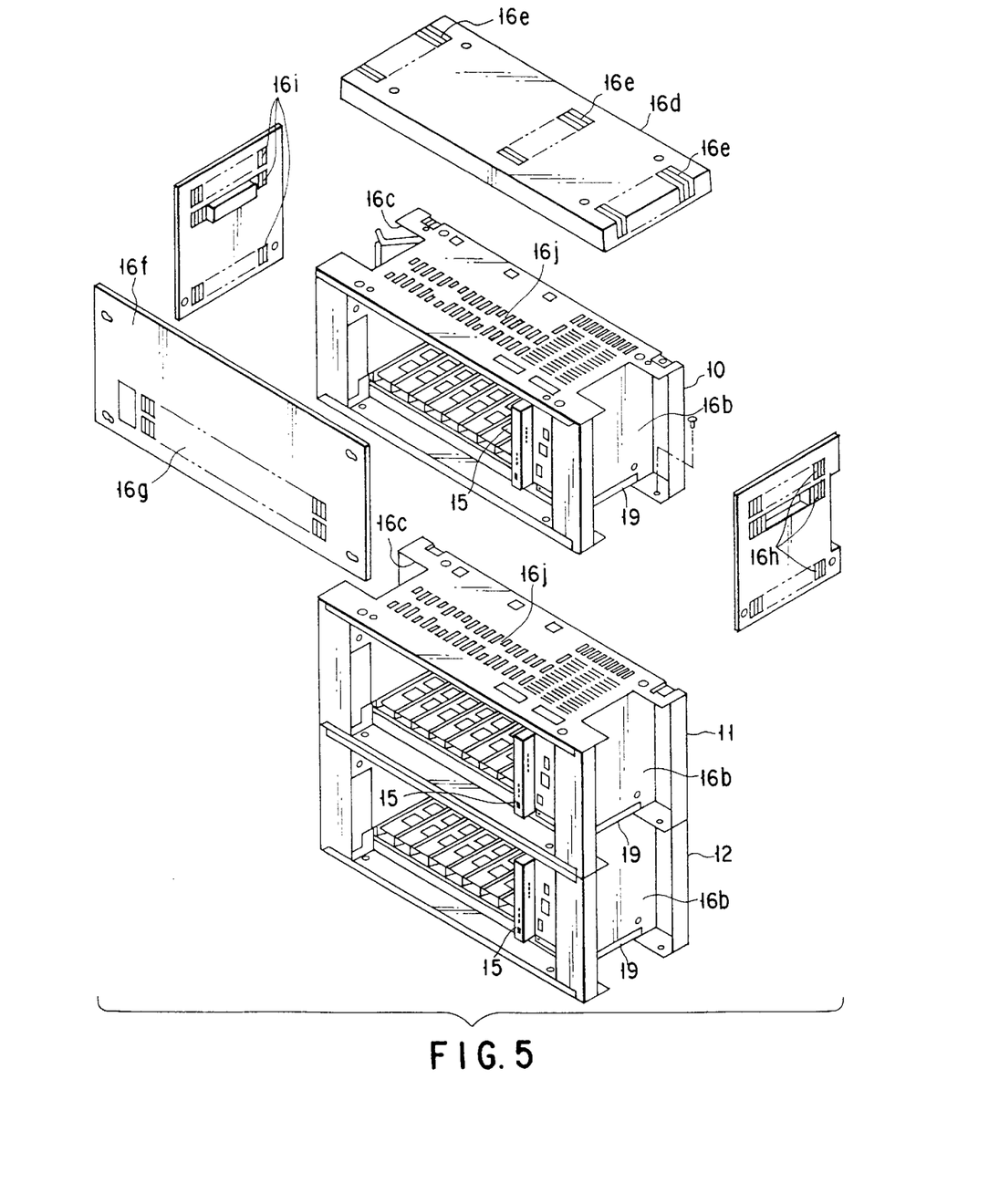
FIG. 5 is an exploded perspective view showing partially the equipment housing of the present invention.
Figure 6:
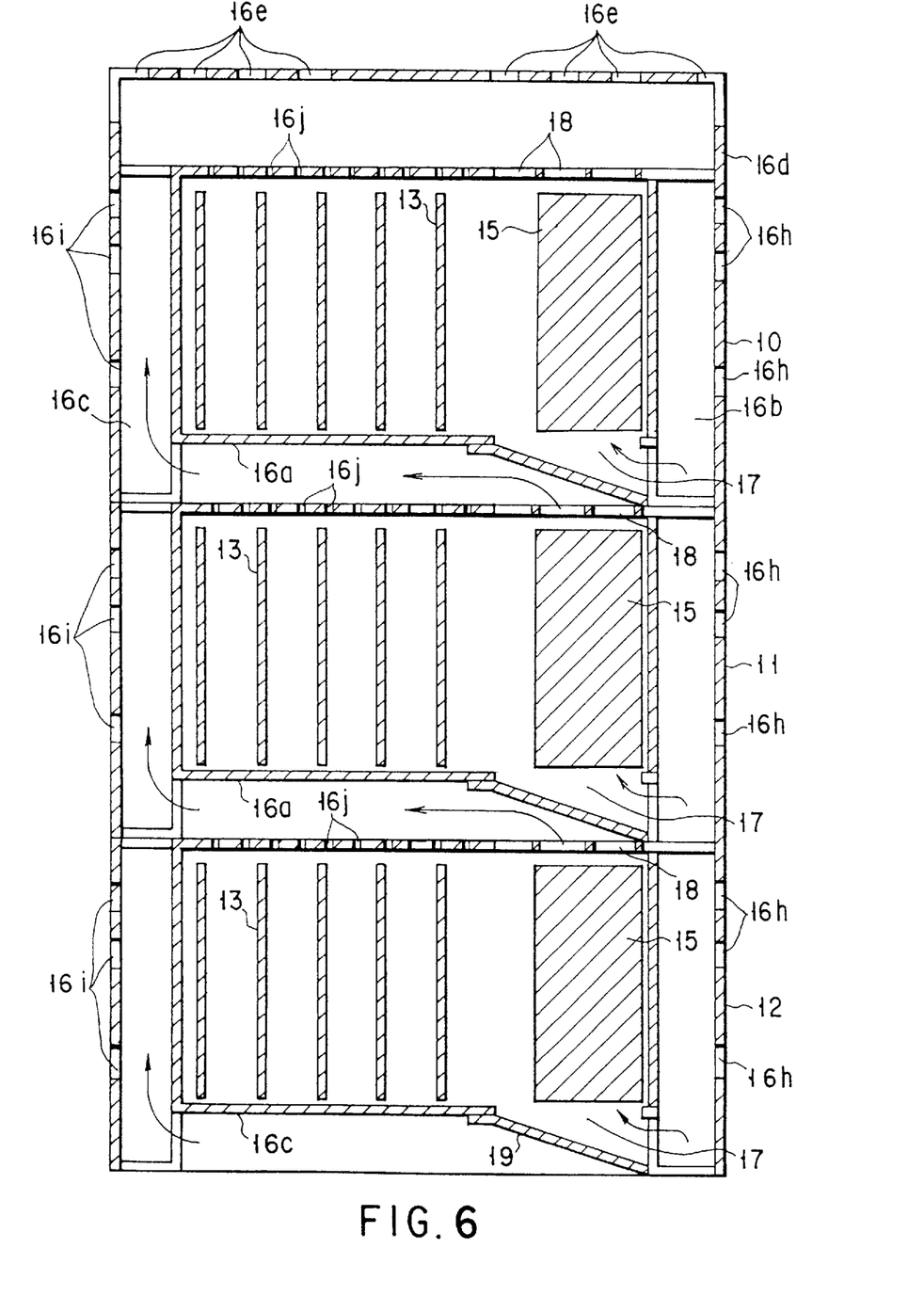
FIG. 6 is a sectional view showing a structure of electronic equipment according to an embodiment of the present invention.
Figure 7:
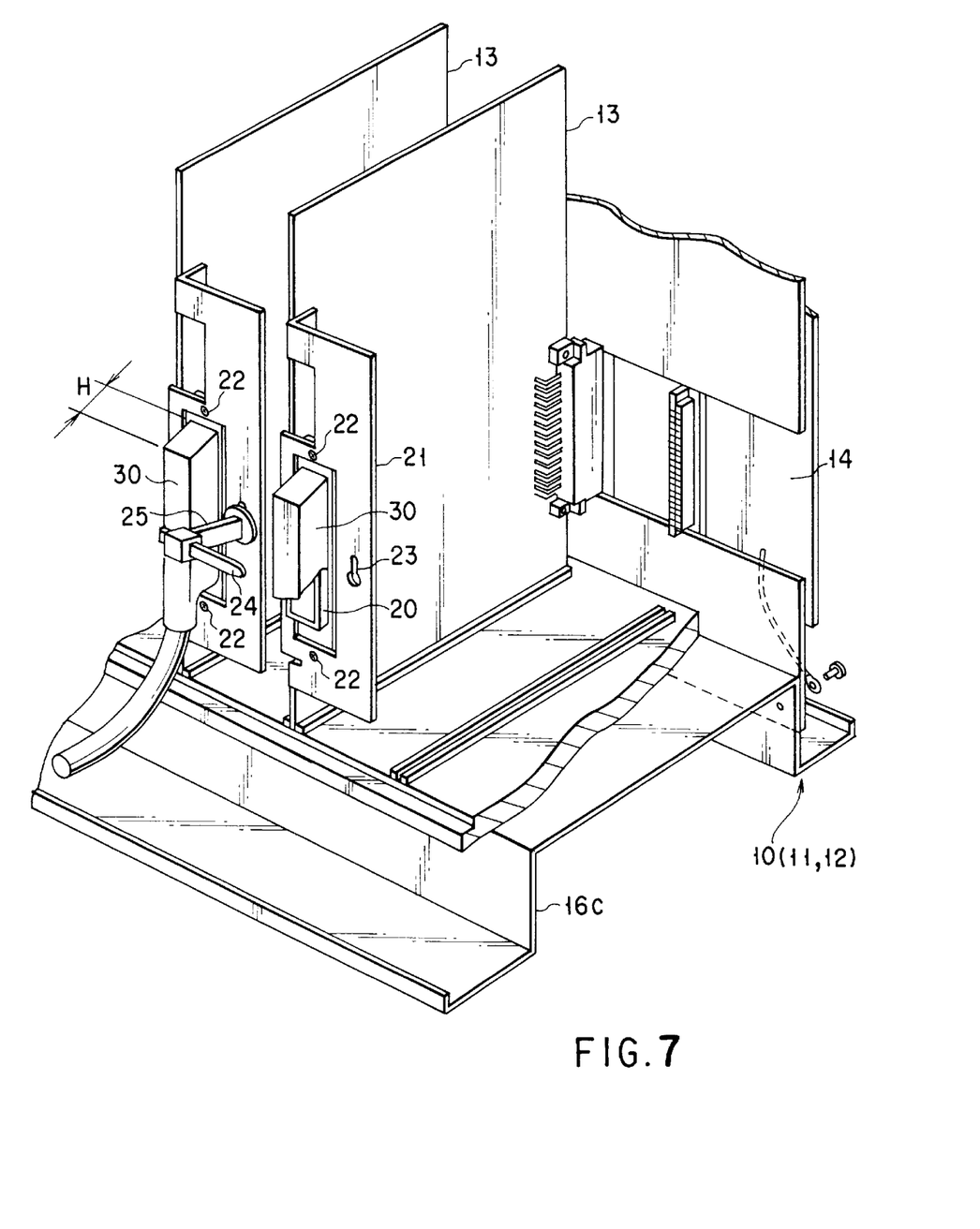
FIG. 7 is a partially perspective view showing an attachment structure of connectors shown in FIG. 6.

FIGS. 5 to 7 show electronic equipment according to the embodiment of the present invention. In first to third equipment housings 10 11 and 12, a plurality of electronic circuit units 13 constituting telephone exchanges are mounted, almost similarly, on system circuit boards 14 with a predetermined distance disposed between two of them. Power supply units 15 are contained in the first to third equipment housings 10 to 12, respectively. The power supply units 15 are electrically connected to the system circuit boards 14 and the electronic circuit units 13, respectively, to supply the power to the system circuit boards 14 and the electronic circuit units 13 and drive them.

Figure 8:
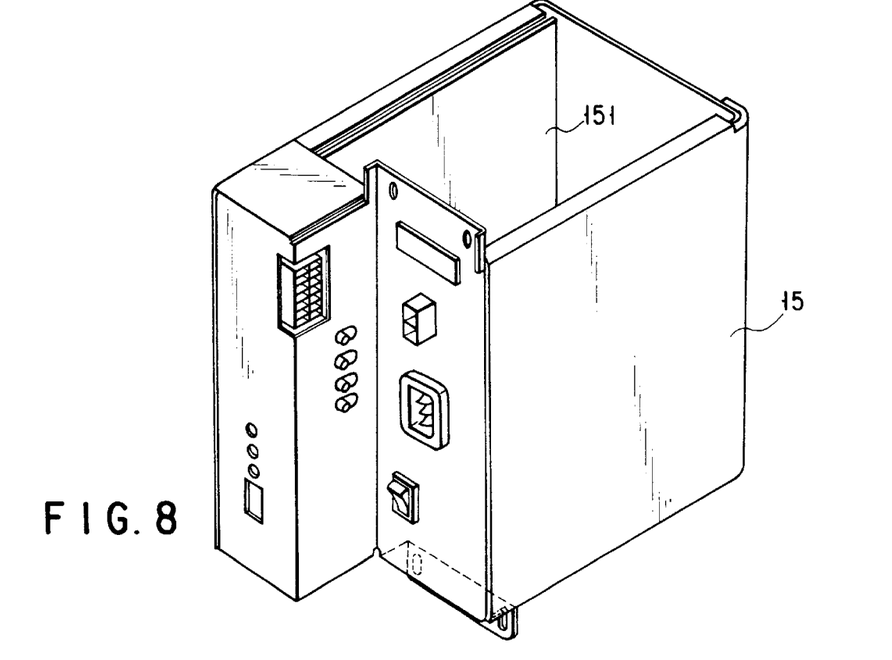
FIG. 8 is a perspective view showing the power supply unit of the present invention as seen from its top.
Figure 9:
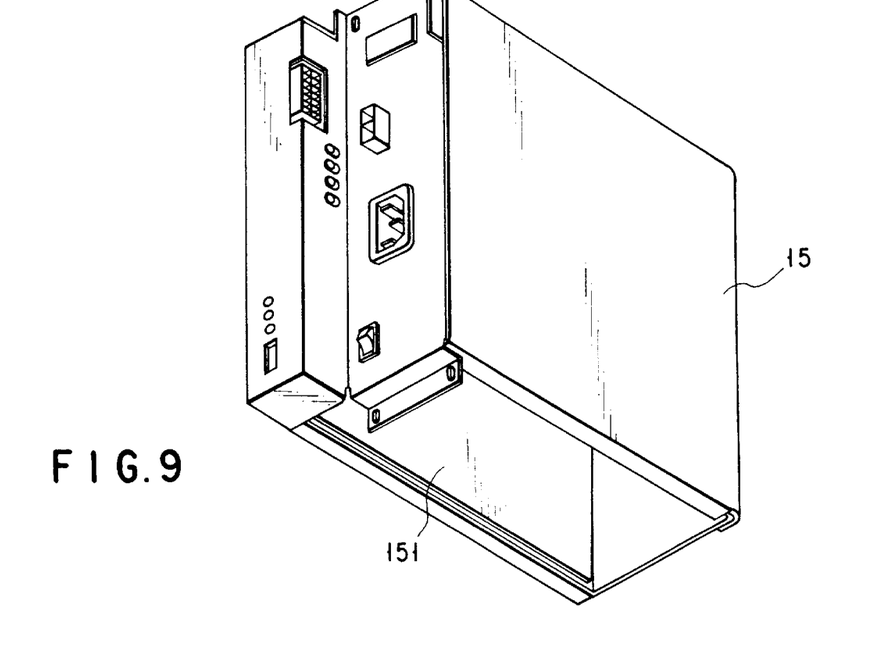
FIG. 9 is a perspective view showing the power supply unit of the present invention as seen from its bottom.

FIGS. 8 and 9 are perspective views showing the power supply unit 15, respectively, as seen from its top and bottom. The power supply unit 15 contains a board 151 on which electronic parts (not shown) that are major elements generating the heat are mounted. The power supply unit 15 is designed to be thinner than the conventional power supply unit 3.

Figure 10:
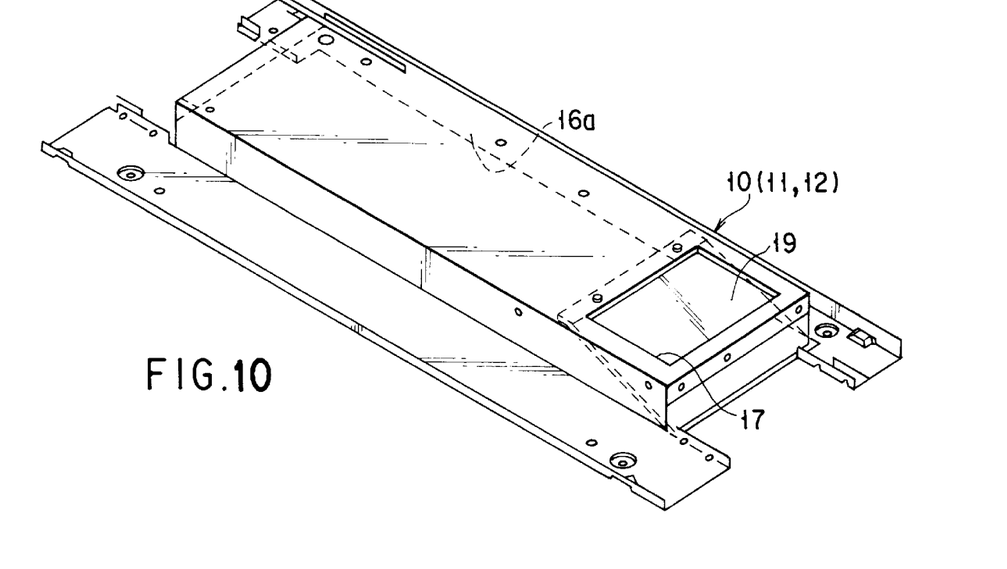
FIG. 10 is a perspective view showing essential parts of FIG. 6.
Figure 11:
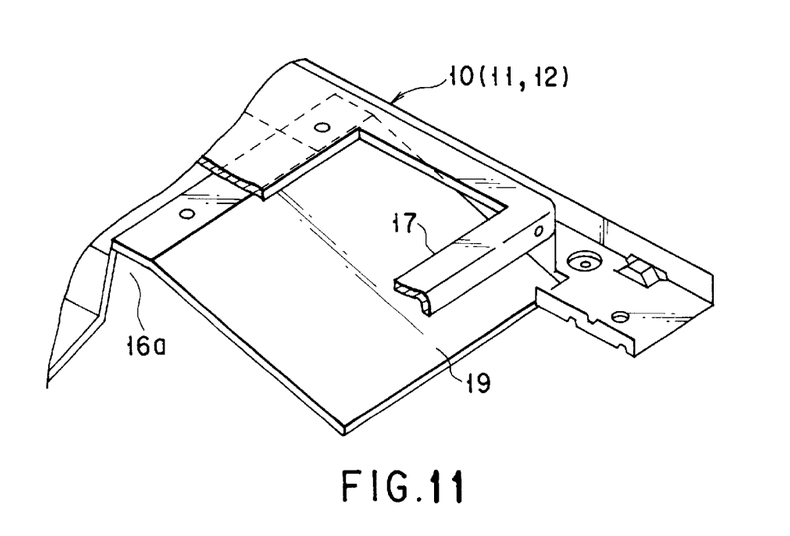
FIG. 11 is a perspective view showing one of the parts of FIG. 10.

In the first to third equipment housings 10 to 12, first and second through air passageways 16b and 16c serving as equipment through air passageways are formed, respectively, on both side portions sandwiching the electronic circuit units 13 and the power supply unit 15. Recess air passageways 16a communicating with the second through air passageways 16c are provided on bottom sides of the first to third equipment housings 10 to 12. In the vicinity of bottom surfaces of the power supply units 15, inclined plates 19 are bridged from bottom portions of the recess air passageways 16a on the first through air passageways 16b side to upper portions of the recess air passageways 16a (see FIGS. 6, 10 and 11). First window portions 17 are provided so that air flows from the first through air passageways 16b to the first to third equipment housings 10 to 12 over upper surfaces of the inclined plates 19.

Figure 2:
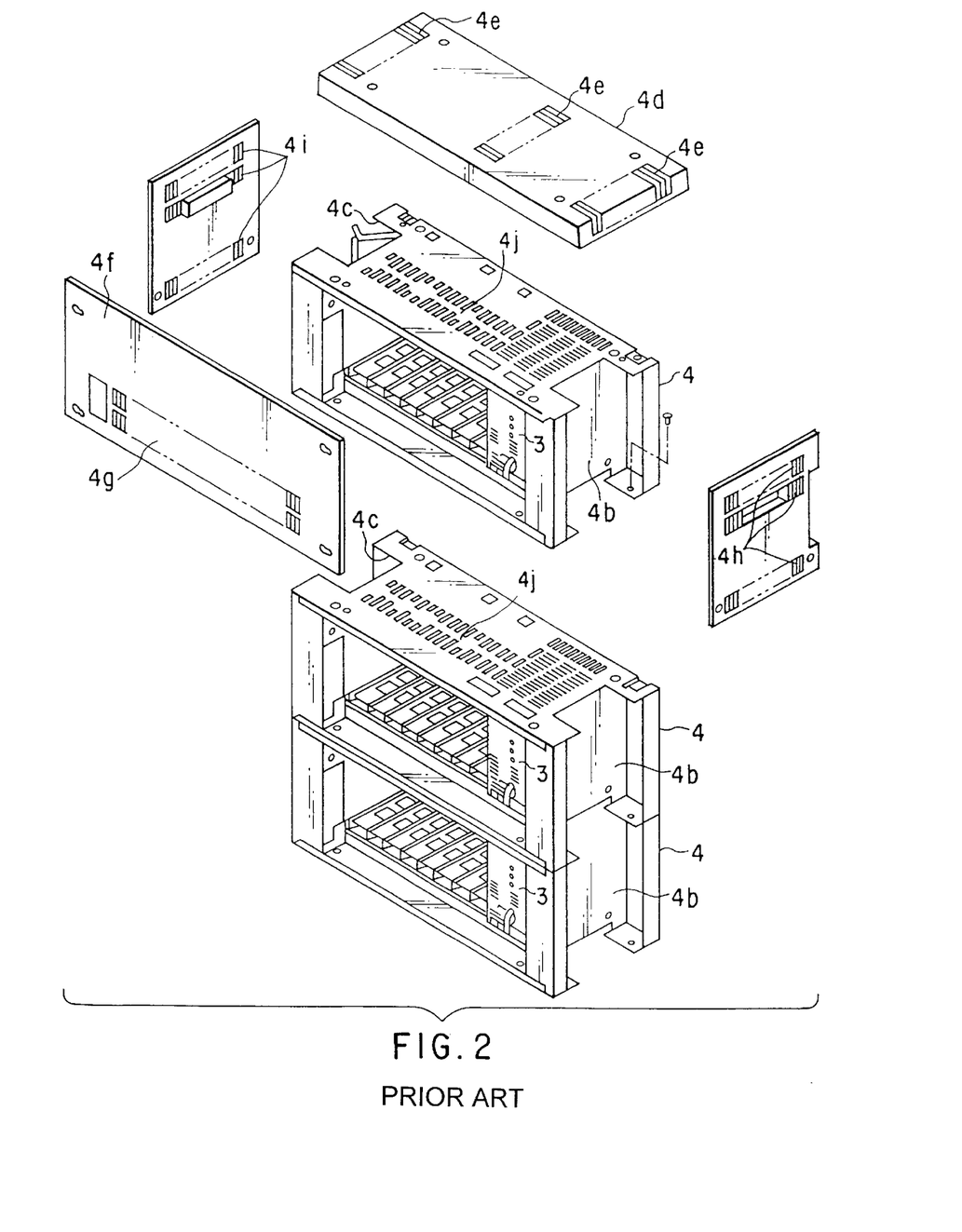
FIG. 2 is an exploded perspective view showing a part of the equipment housing shown in FIG. 1.
Figure 3:
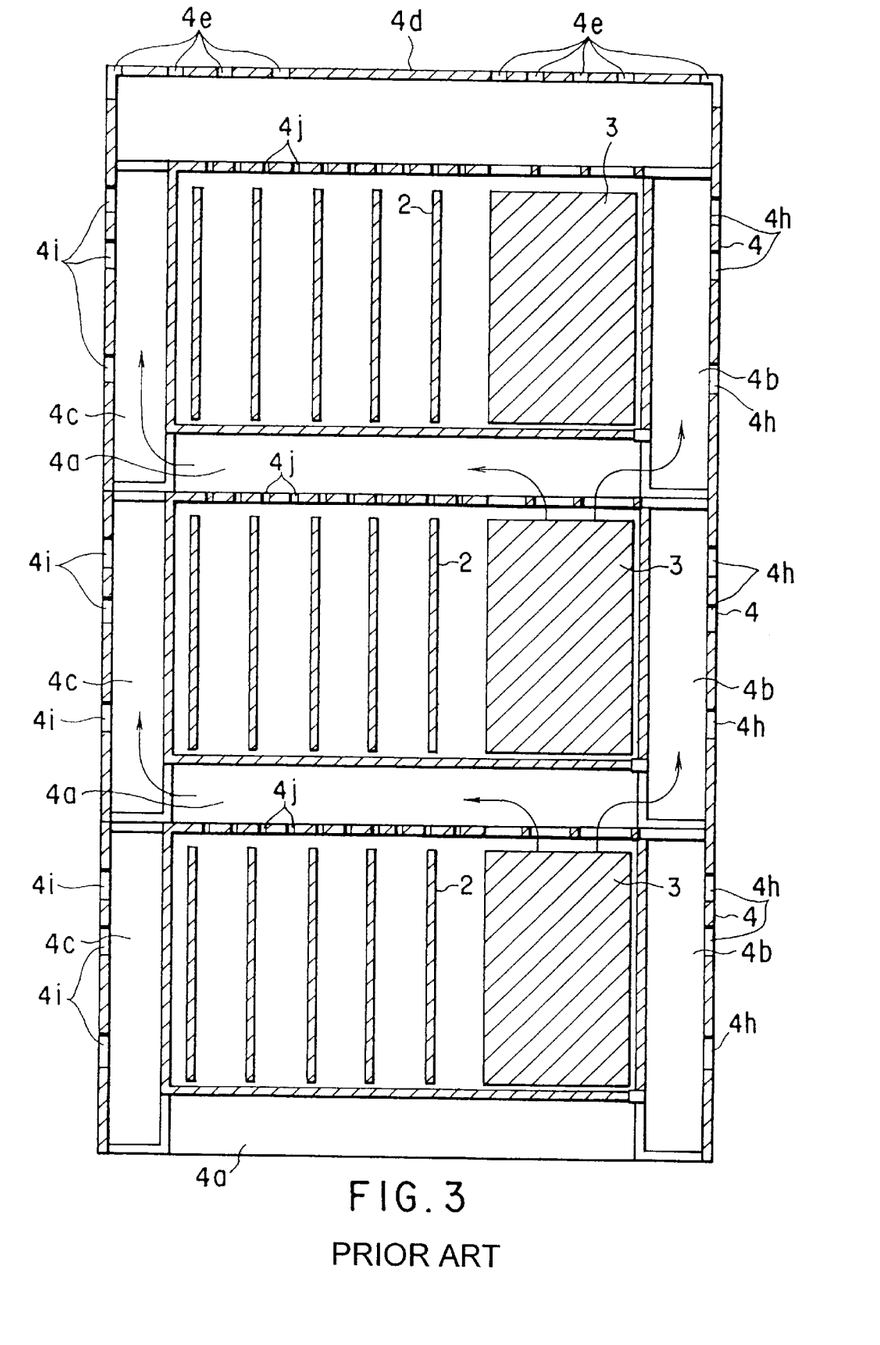
FIG. 3 is a sectional view to explain a problem of a conventional equipment housing.

In addition, ventilation holes 16g are provided on front covers 16f of the first to third equipment housings 10 to 12, in the manner similar to that illustrated in FIG. 2, and air is also taken into the first to third equipment housings 10 to 12 through the ventilation holes 16g.

Second window portions 18 in the vicinity of top surfaces portions of the power supply units 15 are provided in the first to third equipment housings 10 to 12. The second window portion 18 of the first equipment housing 10 at the uppermost stage serves as a ventilation window contacting the outside, and the second window portions 18 of the second and third equipment housings 11 and 12 communicate with the recess air passageways 16a of the first and second equipment housings 10 and 11. Therefore, air flows, under the lower surface of the inclined plates 19 of the first and second equipment housings 10 and 11, from the second window portions 18 of the second and third equipment housings 11 and 12 into the recess air passageways 16a of the first and second equipment housings 10 and 11.

In addition, ventilation windows 16h and 16i corresponding to the first and second through air passageways 16b and 16c are formed on the first to third equipment housings 10 to 12. The air can flow between the interiors of the first and second through air passageways 16b, 16c or the first to third equipment housings 10 to 12 and the exteriors through the ventilation windows 16h and 16i.

In the above-described structure, the air from the first through air passageway 16b is supplied into the equipment housings 10 to 12 through the first window portions 17 by the effect of the inclined plates 19, and the air flowing through the ventilation holes 16g of the front cover 16f is supplied into the equipment housings 10 to 12. When the system circuit boards 14, the electronic circuit units 13 and the power supply circuits 15 are driven and generate heat, the air gets the heat and is exhausted through the second window portions 18 of the first to third equipment housings 10 to 12. The air exhausted through the second window portion 18 of the first equipment housing 10 is exhausted to the outside of the equipment through the through-holes 16e of the top cover 16d above the first equipment housing 10.

The air exhausted through the second window portions 18 of the second and third equipment housings 11 and 12 is led into the second through air passageway 16c through the recess air passageways 16a provided under the bottom portions of the first and second equipment housings 10 and 11, and is exhausted outside of the equipment housings through the window portion 16i of the second through air passageway 16c and the through-holes 16e.

As described above, since the air is taken from the lower side of the equipment housings, heat can be radiated at higher efficiency than a case where the air is taken from the front covers of the side surfaces, in the present invention. Particularly, the efficiency in radiation can be enhanced by taking the air from the lower side of the power supply circuits that generate a large amount of heat. In the comparison of the conventional electronic equipment structure shown in FIG. 3 with the present invention's electronic equipment structure in FIG. 6, the temperature difference of 3.2° C. was measured at the window portions provided at the upper side of the power supply units.

Figure 12:
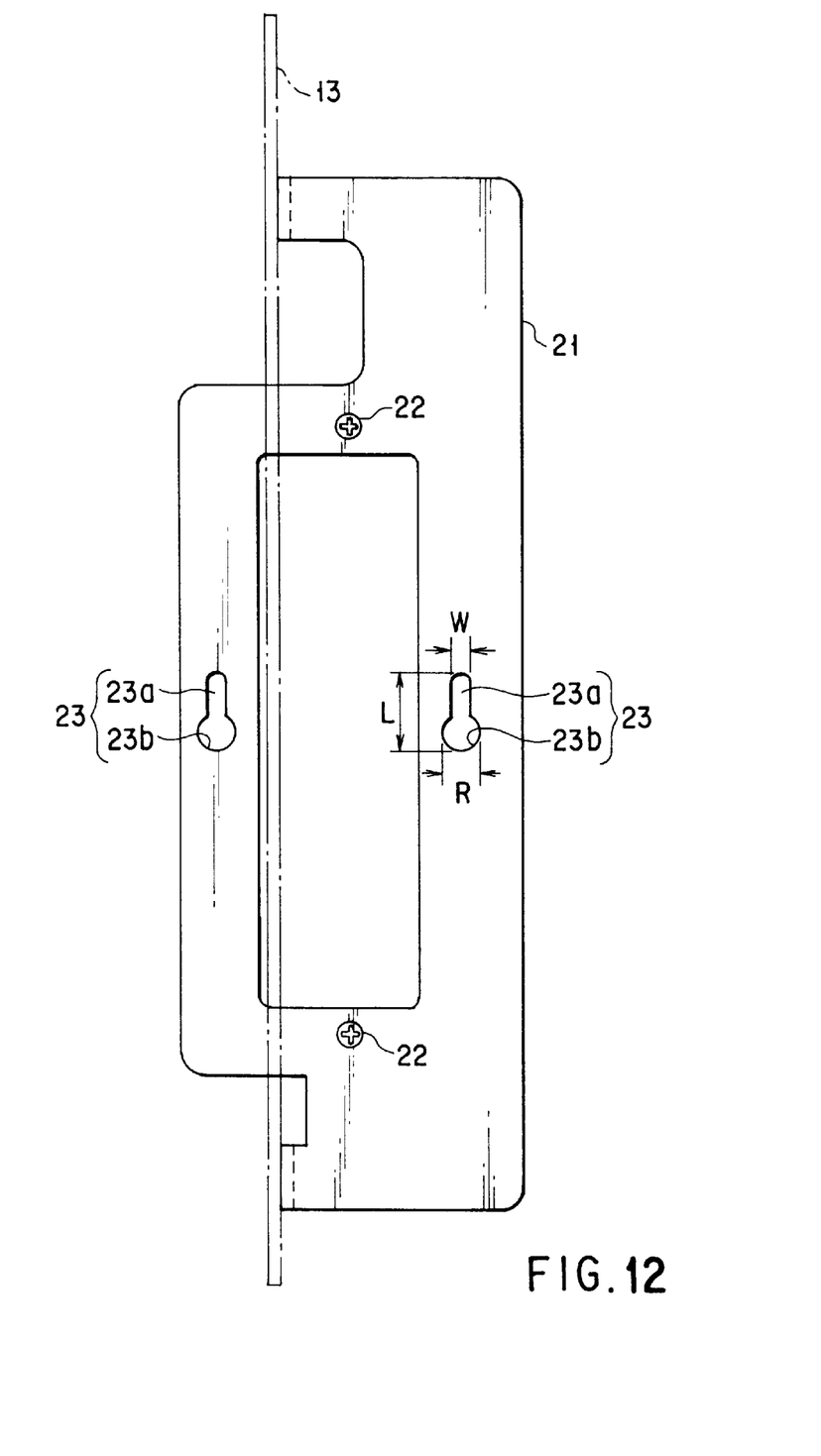
FIG. 12 is a plan view showing an attached state of an electronic circuit unit and a support member shown in FIG. 7.

Further, a connector 20 is arranged on the electronic circuit unit 13 via a support member 21 as shown in FIG. 7. The connector 20 is fitted on the support member 21 by means of a screw member 22. A pair of attachment holes 23 are provided on the support member 21 so as to sandwich the connector 20. Each of the attachment holes 23, as shown in FIG. 12, substantially similarly has an elongated hole 23a, and a circular through-hole 23b formed continuously at an end of the elongated hole 23a with diameter R smaller than the length L of the elongated hole 23a but larger than the width W of the elongated hole 23a.

Figure 13A:
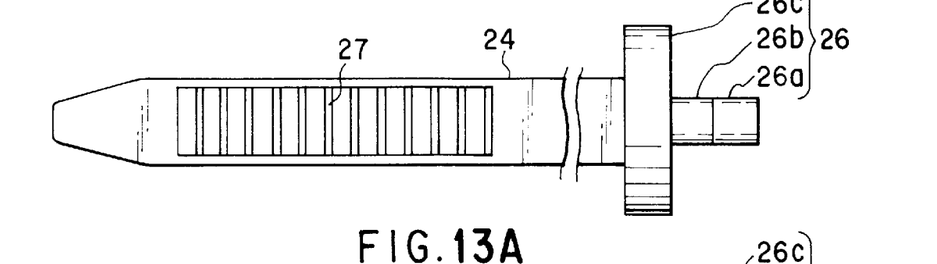
FIGS. 13A and 13B are block diagrams to explain details of a first band of FIG. 7.
Figure 13B:
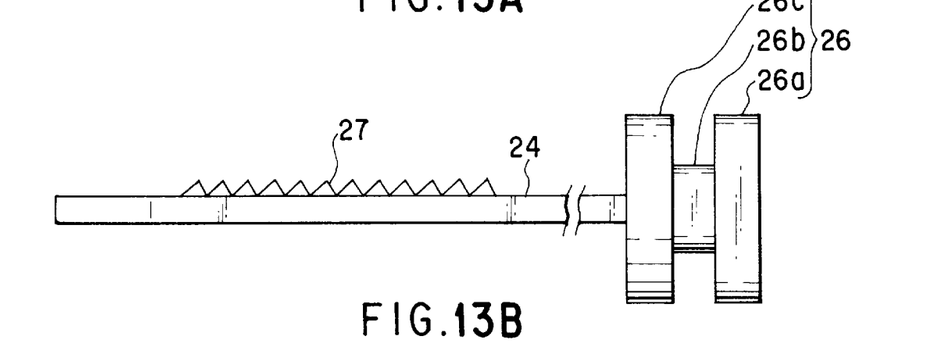
Figure 14:
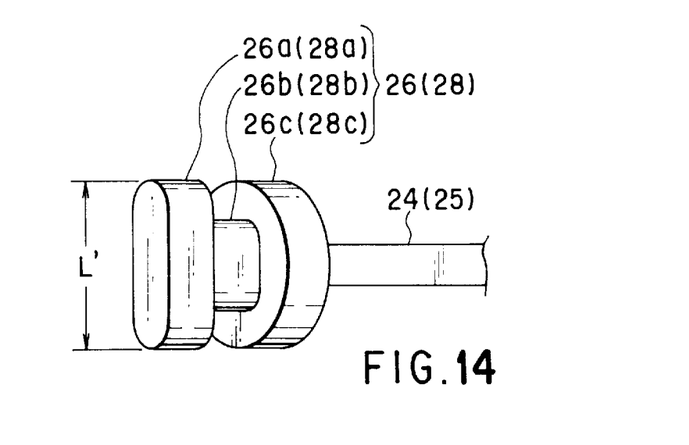
FIG. 14 is a perspective view showing details of the first and second bands of FIG. 7.

First and second bands 24 and 25 formed of resin material such as nylon, for the attachment of the connectors, are mounted on the pair of attachment holes 23. An attachment portion 26 is formed at the top of one end of the first band 24 as shown in FIGS. 13A, 13B and 14. A first protrusion 26a, a second protrusion 26b and a third protrusion 26c are provided coaxially, continuously in order at the attachment portion 26. The first protrusion 26a is formed to have a substantially elongated cross-section to pass through the elongated hole 23a of the attachment hole 23 and a sectional length L' larger than the diameter R of the through-hole 23b. The second protrusion 26b is shaped so as to pass through the elongated hole 23a of the attachment hole 23 with a sectional length smaller than the diameter R of the through-hole 23b but larger than the width W of the elongated hole 23a. The third protrusion 26c is shaped such that it cannot pass through the elongated hole 23a or the through-hole 23b. The length of the second protrusion 26b provided between the first protrusion 26a and the third protrusion 26c is longer than the thickness of the support member 21. A plurality of engagement claws 27 are formed in shape of notches, on the other end of the first band.

Figure 15A:
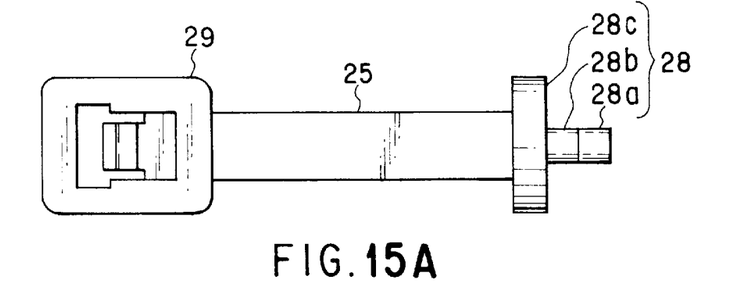
FIGS. 15A and 15B are diagrams to explain details of the second band of FIG. 7.
Figure 15B:
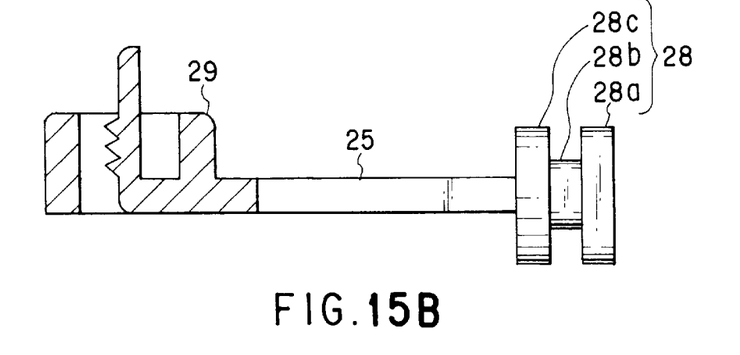

On the other hand, as shown in FIGS. 15A and 15B, the second band 25 has an attachment portion 28 at its one end, similarly to the attachment portion 26 of the first band 24. A first protrusion 28a, a second protrusion 28b and a third protrusion 28c are coaxially provided in order at the attachment portion 28. The first protrusion 28a is formed to have a substantially elongated cross-section to pass through the elongated hole 23a of the attachment hole 23 and a sectional length L' larger than the diameter R of the through-hole 23b. The second protrusion 28b is shaped so as to pass through the elongated hole 23a of the attachment hole 23 with a sectional length smaller than the diameter R of the through-hole 23b but larger than the width W of the elongated hole 23a. The third protrusion 28c is shaped such that it cannot pass through the elongated hole 23a or the through-hole 23b. The length of the second protrusion 28b provided between the first protrusion 28a and the third protrusion 28c is longer than the thickness of the support member 21. A latch portion 29 is provided at the other end of the second band 25 to correspond to the plural engagement claws 27 of the first band 24. The latch portion 29 latches any of the plural engagement claws 27 to variably set the diameter for holding the connector which the first and second bands 24 and 25 form in cooperation.

The connector 30 of the telephone terminal, for example, is selectively attached to or detached from the connector 20 arranged on the support member 21. The connector 30 fitted at the connector 20 is fixed while positioned on the connector 20 by means of the first and second bands 24 and 25.

Figure 16A:
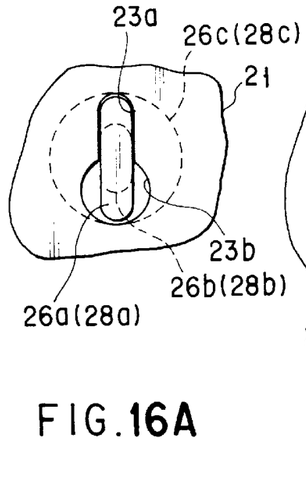
FIGS. 16A to 16C are plan views showing steps of attaching attachment portions of the first and second bands of FIG. 7 to attachment holes of the support member.
Figure 16B:
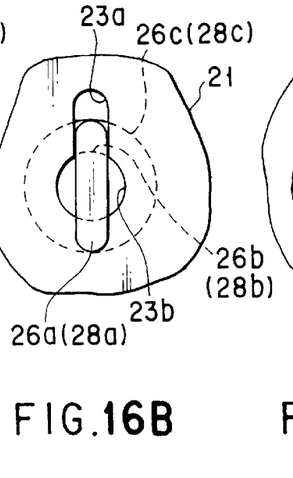
Figure 16C:
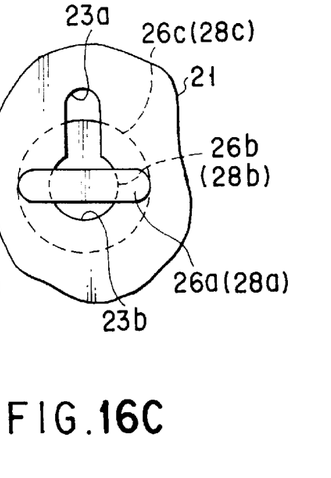

That is, after the first protrusions 26a and 28a of the first and second bands 24 and 25 are inserted into the elongated hole 23a of the attachment hole 23 of the support member 21 as shown in FIG. 16A, the second protrusions 26b and 28b are moved into the through-hole 23b of the attachment hole 23 (FIG. 16B) and rotated at approximately 90 degrees (FIG. 16C). By these operations, the circumferential part of the through-hole 23b of the attachment hole 23 is sandwiched between the first protrusions 26a, 28a and the third protrusions 26c, 28c of the attachment portions 26 and 28 of the first and second bands 24 and 25, as shown in FIG. 16C. The first and second bands 24 and 25 are thereby attached onto the support member 21.

Further, the plural engagement claws 27 of the first band 24 are inserted into the latch portion 29 of the second band 25, the position of the plural engagement claws 27 engaged by the latch portion 29 is adjusted in response to the size of connector 30, and the connector 30 is positioned and fixed on the connector 20 by means of the first and second bands 24 and 25. When the engagement of the engagement claws 27 made by the latch portion 29 is released, the latch portion 29 is separated from the engagement claws 27 in resistance to its elastic force.

As explained above, the electronic equipment according to the preferred embodiment of the present invention is constituted such that the first and second through air passageways 16b and 16c are formed on the first to third equipment housings 10 to 12; the second through air passageway 16c communicates with the recess air passageways 16a; and the air in the first through air passageway 16b is supplied into the insides of the first to third equipment housings 10 to 12 through their lower parts to discharge the exhaust from the first equipment housing 10 directly out of the equipment through the second window portion 18, and to lead the exhaust from the second and third equipment housings 11 and 12 into the second through air passageway 16c via the second window portion 18 and the recess air passageway 16a and discharge them out of the equipment.

Thus, when the electronic circuit units 13 and the power supply units 15 are driven and generate heat, the heat in the first to third equipment housings 10 to 12 is discharged by the air supplied from the lower parts of the equipment housings 10 to 12 and discharged from the second window portions 18 formed at the upper parts thereof, or by the air supplied from the lower parts of the equipment housings 10 to 12 and discharged through the second window portions 18, the recess air passageways 16a and the second through air passageway 16c. Effective heat radiation from within the equipment housings can be thereby realized. Therefore, heat can be radiated at high efficiency from within the tiered first to third equipment housings 10 to 12.

In the electronic equipment according to the preferred embodiment of the present invention, heat radiation can be carried out at high efficiency since the first window portion 17 and the second window portion 18 are provided near the power supply units 15 that are electronic circuit units generating a large amount of heat.

Further, in the electronic equipment according to the preferred embodiment of the present invention, on each of the support member 21 where the connectors 20 of the electronic circuit units 13 of the first to third equipment housings 10 to 12 are arranged, a pair of attachment holes 23 are formed so as to sandwich the connector 20, the connector 30 mounted on the connector 20 is positioned and fixed by inserting the attachment portions 26 and 28 of the adjustable first and second bands 24 and 25 into the attachment holes 23, and latching any of the plural engagement claws 27 of the first band 24 with the latch portion 29 of the second band 25.

According to this, the connectors 30 having different dimensions can be positioned and fixed on the support member 21 by using the first and second bands 24 and 25. Therefore, the connectors 30 of various shapes having different height H and the like can be attached to connectors 20 of the electronic circuit units 13 in the first to third equipment housings 10 to 12. As a result, management of parts for the equipment assembly can be simplified and the assembly operations can be improved.

Moreover, in the electronic equipment according to the preferred embodiment of the present invention, the diameter R of the circular through-hole 23b is set to be larger than the width W of the elongated hole 23a, and the sectional length of the second protrusions 26b and 28b is set to be smaller than the diameter of the through-hole 23b and larger than the width W of the elongated hole 23a.

For this reason, when the second protrusions 26b and 28b are moved into the through-hole 23b after inserting the first protrusions 26a and 28a of the bands 24 and 25 into the elongated hole 23a, and then the bands 24 and 25 are turned at approximately 90 degrees, the second protrusions 26b and 28b can be prevented from moving vertically inside the attachment hole 23.

In addition, in the electronic equipment according to the preferred embodiment of the present invention, the diameter R of the circular through-hole 23b is set to be smaller than the length L of the elongated hole 23a, and the sectional length L' of the first protrusions 26a and 28a is set to be larger than the diameter R of the through-hole 23b.

For this reason, when the second protrusions 26b and 28b are moved into the through-hole 23b after inserting the first protrusions 26a and 28a of the bands 24 and 25 into the elongated hole 23a, and then the bands 24 and 25 are turned at approximately 90 degrees, the first protrusions 26a and 28a can be prevented from passing through the through-hole 23b and coming out therefrom.

In the above embodiment, the electronic equipment where three equipment housings 10 to 12 are tiered has been described. However, the number is not limited to this and substantially the same advantage can be obtained even if any number of equipment housings are tiered.

In addition, in the above embodiment, regarding the adjustable first and second bands 24 and 25, any of the plural engagement claws 27 of the first band 24 is latched by the latch portion 29 of the second protrusion 25. However, the other engaging means may be provided at the first band 24, and the engaging means that can adjustably engage with this engaging means may be provided at the second band 25.

Thus, the present invention is not limited to the above-described embodiment and, of course, can be modified variously within a range which does not exceed the gist of this invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. Electronic equipment comprising:

a plurality of equipment housings containing electronic circuit units and being tiered;

first and second housing through air passageways provided respectively at both sides sandwiching the electronic circuit units of the plural equipment housings, the first housing through air passageways communicating with each other and the second housing through air passageways communicating with each other;

first air passageways provided respectively at lower parts of the plural equipment housings to supply air of the first housing through air passageway into the insides of plural equipment housings;

ventilation windows provided respectively at upper parts of the plural equipment housings; and second air passageways provided respectively at bottom portions of the plural equipment housings to transmit heat from the ventilation windows of the equipment housings at lower stages into the second housing through air passageway.

2. Electronic equipment according to claim 1, wherein the first and second housing through air passageways comprise air windows.

3. Electronic equipment according to claim 1, wherein the electronic circuit units include power supply unit.

4. Electronic equipment according to claim 1, wherein the first air passageways and the ventilation windows are provided in the vicinity of the electronic circuit units generating heat.

5. Electronic equipment according to claim 4, wherein the electronic circuit units generating heat are power supply units.

6. Electronic equipment according to claim 1, wherein ventilation holes are provided respectively on front surfaces of the plural equipment housings.

7. An equipment housing containing electronic circuit units, comprising:

first and second air passageways provided at both sides sandwiching the electronic circuit units;

a third air passageway provided at a lower part of the equipment housing to supply air in the first air passageway into the inside of the equipment housing;

a ventilation window provided at an upper part of the equipment housing; and a fourth air passageway provided at a bottom part of the equipment housing to supply air into the second air passageway.

8. An equipment housing according to claim 7, wherein the first and second air passageways have air windows.

9. An equipment housing according to claim 7, wherein the electronic circuit units include a power supply unit.

10. An equipment housing according to claim 7, wherein the third air passageway and the ventilation window are provided in the vicinity of the electronic circuit unit generating heat.

11. An equipment housing according to claim 10, wherein the electronic circuit unit generating heat is a power supply unit.

12. An equipment housing according to claim 7, wherein ventilation holes are provided on front surfaces of the equipment housing.

13. Electronic equipment comprising a plurality of equipment housings containing electronic circuit units and being tiered, each of the equipment housings comprising:

first and second air passageways provided at both sides sandwiching the electronic circuit units;

a third air passageway provided at a lower part of the equipment housing to supply air in the first air passageway into the insides of the equipment housing;

a ventilation window provided at an upper part of the equipment housing; and a fourth air passageway provided at a bottom part of the equipment housing to supply air into the second air passageway, wherein the first air passageways of the plural equipment housings communicate with each other, the second air passageways of the plural equipment housings communicate with each other and air is supplied to the fourth air passageway located at a higher equipment housing through the ventilation window located at a lower equipment housing.

14. Electronic equipment according to claim 13, wherein the first and second air passageways comprise air windows.

15. Electronic equipment according to claim 13, wherein the electronic circuit units include a power supply unit.

16. Electronic equipment according to claim 13, wherein the third air passageway and the ventilation window are provided in the vicinity of the electronic circuit unit generating heat.

17. Electronic equipment according to claim 16, wherein the electronic circuit unit generating heat is a power supply unit.

18. Electronic equipment according to claim 13, wherein ventilation holes are provided on front surfaces of the equipment housing.

* * * * *